(12) United States Patent
Chen et al.

(10) Patent No.: US 10,125,422 B2
(45) Date of Patent: Nov. 13, 2018

(54) HIGH IMPEDANCE RF FILTER FOR HEATER WITH IMPEDANCE TUNING DEVICE

(71) Applicant: Applied Materials, Inc., Santa Clara, CA (US)

(72) Inventors: Jian J. Chen, Fremont, CA (US); Mohamad A. Ayoub, Los Gatos, CA (US); Juan Carlos Rocha-Alvarez, San Carlos, CA (US); Zheng John Ye, Milpitas, CA (US); Ramprakash Sankarakrishnan, Santa Clara, CA (US); Jianhua Zhou, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 588 days.

(21) Appl. No.: 14/228,227

(22) Filed: Mar. 27, 2014

(65) Prior Publication Data

US 2014/0302256 A1 Oct. 9, 2014

Related U.S. Application Data

(60) Provisional application No. 61/805,872, filed on Mar. 27, 2013.

(51) Int. Cl.
| | | |
|---|---|---|
| H01L 21/00 | (2006.01) | |
| C23C 16/00 | (2006.01) | |
| C23C 16/46 | (2006.01) | |
| C23C 16/509 | (2006.01) | |
| H01J 37/32 | (2006.01) | |

(52) U.S. Cl.
CPC .......... *C23C 16/46* (2013.01); *C23C 16/5096* (2013.01); *H01J 37/32174* (2013.01); *H01J 37/32183* (2013.01); *H01J 37/32715* (2013.01); *H01J 37/32724* (2013.01)

(58) Field of Classification Search
None
See application file for complete search history.

(56) References Cited

U.S. PATENT DOCUMENTS

| | | | | |
|---|---|---|---|---|
| 5,968,379 A | * | 10/1999 | Zhao | ............... C23C 16/45565 |
| 6,617,553 B2 | * | 9/2003 | Ho | ................. H01L 21/67103 |
| | | | | 219/444.1 |
| 2003/0037881 A1 | * | 2/2003 | Barnes | .............. H01J 37/3244 |
| | | | | 156/345.44 |

(Continued)

*Primary Examiner* — Parviz Hassanzadeh
*Assistant Examiner* — Michelle Crowell
(74) *Attorney, Agent, or Firm* — Patterson + Sheridan, LLP (57) ABSTRACT

Embodiments provide a plasma processing apparatus, substrate support assembly, and method of controlling a plasma process. The apparatus and substrate support assembly include a substrate support pedestal, a tuning assembly that includes a tuning electrode that is disposed in the pedestal and electrically coupled to a radio frequency (RF) tuner, and a heating assembly that includes one or more heating elements disposed within the pedestal for controlling a temperature profile of the substrate, where at least one of the heating elements is electrically coupled to an RF filter circuit that includes a first inductor configured in parallel with a formed capacitance of the first inductor to ground. The high impedance of the RF filters can be achieved by tuning the resonance of the RF filter circuit, which results in less RF leakage and better substrate processing results.

15 Claims, 5 Drawing Sheets

(56) References Cited

U.S. PATENT DOCUMENTS

| | | | | |
|---|---|---|---|---|
| 2003/0051665 A1* | 3/2003 | Zhao | ............... | C23C 16/45565 |
| | | | | 118/723 E |
| 2005/0194374 A1* | 9/2005 | Gelatos | ............... | H05B 3/283 |
| | | | | 219/444.1 |
| 2006/0272774 A1* | 12/2006 | Maehara | ............ | H01L 21/68757 |
| | | | | 156/345.28 |
| 2007/0113787 A1* | 5/2007 | Higashiura | ....... | H01J 37/32082 |
| | | | | 118/723 E |
| 2007/0227450 A1* | 10/2007 | Maebashi | ............... | C23C 16/14 |
| | | | | 118/723 R |
| 2007/0274324 A1* | 11/2007 | Wu | ........................ | H04L 1/0076 |
| | | | | 370/400 |
| 2007/0284344 A1* | 12/2007 | Todorov | ............ | H01J 37/32706 |
| | | | | 219/121.54 |
| 2008/0035306 A1* | 2/2008 | White | ................ | C23C 16/4586 |
| | | | | 165/61 |
| 2008/0197780 A1* | 8/2008 | Yamazawa | ........ | H01J 37/32091 |
| | | | | 315/111.21 |
| 2008/0236493 A1* | 10/2008 | Sakao | ................ | H01J 37/32091 |
| 2009/0133839 A1* | 5/2009 | Yamazawa | ......... | H01J 37/32091 |
| | | | | 156/345.37 |
| 2009/0236214 A1* | 9/2009 | Janakiraman | ..... | C23C 16/45565 |
| | | | | 204/164 |
| 2010/0018648 A1* | 1/2010 | Collins | ............. | H01J 37/32082 |
| | | | | 156/345.24 |
| 2012/0006493 A1* | 1/2012 | White | .................. | C23C 16/4586 |
| | | | | 156/345.52 |
| 2013/0001215 A1* | 1/2013 | Chang | ................. | F27B 17/0025 |
| | | | | 219/391 |
| 2013/0126206 A1* | 5/2013 | Zhou | ................. | H01J 37/32577 |
| | | | | 174/68.1 |
| 2013/0284374 A1* | 10/2013 | Lubomirsky | .......... | H02N 13/00 |
| | | | | 156/345.51 |
| 2013/0284709 A1* | 10/2013 | Makhratchev | ...... | H01L 21/6833 |
| | | | | 219/121.43 |
| 2014/0290576 A1* | 10/2014 | Chen | ................. | H01J 37/32183 |
| | | | | 118/708 |
| 2017/0069464 A1* | 3/2017 | Ye | ..................... | H01L 21/67103 |

* cited by examiner

HIGH IMPEDANCE RF FILTER FOR HEATER WITH IMPEDANCE TUNING DEVICE

CROSS-REFERENCE TO RELATED APPLICATIONS

This application claims benefit of U.S. provisional patent application Ser. No. 61/805,872, filed Mar. 27, 2013 which is herein incorporated by reference.

BACKGROUND OF THE INVENTION

Field of the Invention

Embodiments of the present invention generally relate to an apparatus and method for processing substrates.

Description of the Related Art

In the manufacture of integrated circuits and other electronic devices, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit and flat panel display fabrication with stringent thermal budgets, such as for very large scale or ultra-large scale integrated circuit (VLSI or ULSI) device fabrication.

Plasma processing, such as plasma enhanced chemical vapor deposition (PECVD), is used to deposit materials, such as blanket dielectric films on substrates, such as semiconductor wafers. A challenge for current plasma processing chambers and processes includes controlling critical dimension uniformity during plasma deposition processes. A particular challenge includes substrate center to edge thickness uniformity in films deposited using current plasma processing chambers and techniques.

One problem that has been encountered with plasma processing in integrated circuit fabrication is that devices may become damaged as a result of exposure to non-uniform plasma conditions, such as electric field gradients. The susceptibility or degree of device damage depends on the stage of device fabrication and the specific device design. Devices containing an insulating or dielectric layer deposited on a substrate are susceptible to damage due to charges and/or potential gradients accumulating on the surface of the dielectric layer.

Therefore, there is a need for an improved method and apparatus for plasma processing.

SUMMARY OF THE INVENTION

In one embodiment, a plasma processing apparatus includes a chamber body and a powered gas distribution manifold enclosing a process volume, and a pedestal disposed in the process volume for supporting a substrate. The apparatus further includes a tuning assembly that includes a tuning electrode that is disposed in the pedestal and electrically coupled to a radio frequency (RF) tuner, and a heating assembly that includes one or more heating elements disposed within the pedestal for controlling a temperature profile of the substrate, where at least one of the heating elements is electrically coupled to an RF filter circuit that includes a first inductor configured in parallel with a formed capacitance of the first inductor to ground.

In another embodiment, a substrate support assembly includes a substrate support pedestal, a tuning assembly that includes a tuning electrode that is disposed in the pedestal and electrically coupled to a radio frequency (RF) tuner, and a heating assembly that includes one or more heating elements disposed within the pedestal for controlling a temperature profile of the substrate, where at least one of the heating elements is electrically coupled to an RF filter circuit that includes a first inductor configured in parallel with a formed capacitance of the first inductor to ground.

In another embodiment, a method is provided of controlling a plasma process using a tuning circuit, and a radio frequency (RF) filter circuit coupled to a heater circuit. The method includes controlling an impedance of the tuning circuit to increase the amount of RF energy delivered to a tuning electrode of the tuning circuit, and using the RF filter circuit to prevent RF energy from coupling to the heater circuit, where the RF filter circuit comprises a first inductor configured in parallel with a formed capacitance of the first inductor to ground.

Embodiments of the disclosure may further provide a plasma processing apparatus, comprising a chamber body and a powered gas distribution manifold enclosing a process volume, a pedestal disposed in the process volume and having a substrate supporting surface, a heating assembly comprising one or more heating elements disposed within the pedestal for controlling a temperature profile of the substrate, wherein at least one of the heating elements is electrically coupled to a radio frequency (RF) filter circuit comprising a first inductor configured in parallel with a first capacitance, and a tuning assembly comprising a tuning electrode that is disposed within the pedestal between the one or more heating elements and the substrate supporting surface, wherein the tuning electrode is electrically coupled to a first RF tuner.

Embodiments of the disclosure may further provide a substrate support assembly, comprising a substrate support pedestal having a substrate supporting surface, a heating assembly comprising one or more heating elements disposed within the pedestal for controlling a temperature profile of the substrate, wherein at least one of the heating elements is electrically coupled to a radio frequency (RF) filter circuit comprising a first inductor configured in parallel with a first capacitance, and a tuning assembly comprising a tuning electrode that is disposed within the pedestal and is electrically coupled to an RF tuner.

Embodiments of the disclosure may further provide a method of plasma processing a substrate, comprising generating an RF plasma in a processing volume of a processing chamber, controlling an impedance of the tuning circuit, wherein controlling the impedance includes minimizing the impedance of a tuning electrode disposed within a substrate supporting pedestal to ground, and reducing RF coupling between a heater element disposed within the substrate supporting pedestal and the generated RF plasma, wherein reducing the RF coupling to the heater element comprises coupling an RF filter circuit that comprises a first inductor that is in parallel with a first capacitance to the heater element.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or in the following detailed description.

Greater uniformity in deposited and/or etched films may be achieved through greater control of the process variables and application of process inputs, such as RF energy and substrate thermal control. RF energy is typically delivered to a powered electrode, and an RF field is established between the powered electrode and a grounding electrode. The RF field is combined with process gases to deposit layers of material onto a substrate or etch material layers from the substrate. As components used to control the temperature of the substrate during processing may be disposed near the grounding electrode, RF energy may capacitively couple to the heating elements, normally referred to as RF leakage. RF leakage to these undesired paths, such as heating elements may negatively alter the substrate processes (i.e., deposition rate and uniformity) and may also cause electromagnetic interference (EMI) within and/or damage the AC power sources.

According to various embodiments, a substrate support pedestal may include a tuning electrode 112 (such as a conductive mesh) providing a primary path to ground for RF energy. The tuning electrode may be coupled to an RF tuner to present a lower impedance path and thereby prevent RF leakage into other components within the substrate support pedestal. The substrate support pedestal may also include a heating assembly that includes heating elements 150 and one or more conductive rods (e.g., rods 122, 155) disposed along the length of the shaft of the pedestal (e.g., stem 114). The conductive rods may be preferentially spaced apart to prevent undesired coupling to other rods or to other conductive components, such as the pedestal base. The heating assembly may include an AC source 165 that is coupled to the rods through one or more RF filters 160. In order to minimize the impedance of the connections between the rods and RF filters, the RF filters may be disposed proximate to the pedestal base and coupled using a short rigid lead for each rod. Each lead may be spaced apart to prevent coupling with other leads. The RF filters may generally block RF leakage into components of the heating assembly, increasing process efficiency and improving process results (e.g., uniformity) and preventing the RF energy from causing EMI within and/or damage to the AC source. The components of the RF filters may be selected to provide a desired impedance value at the RF operating frequencies, and may compensate for capacitances of the filter components (such as intra-winding capacitance, parasitic capacitance, and coupling to other components).

Figure 1:
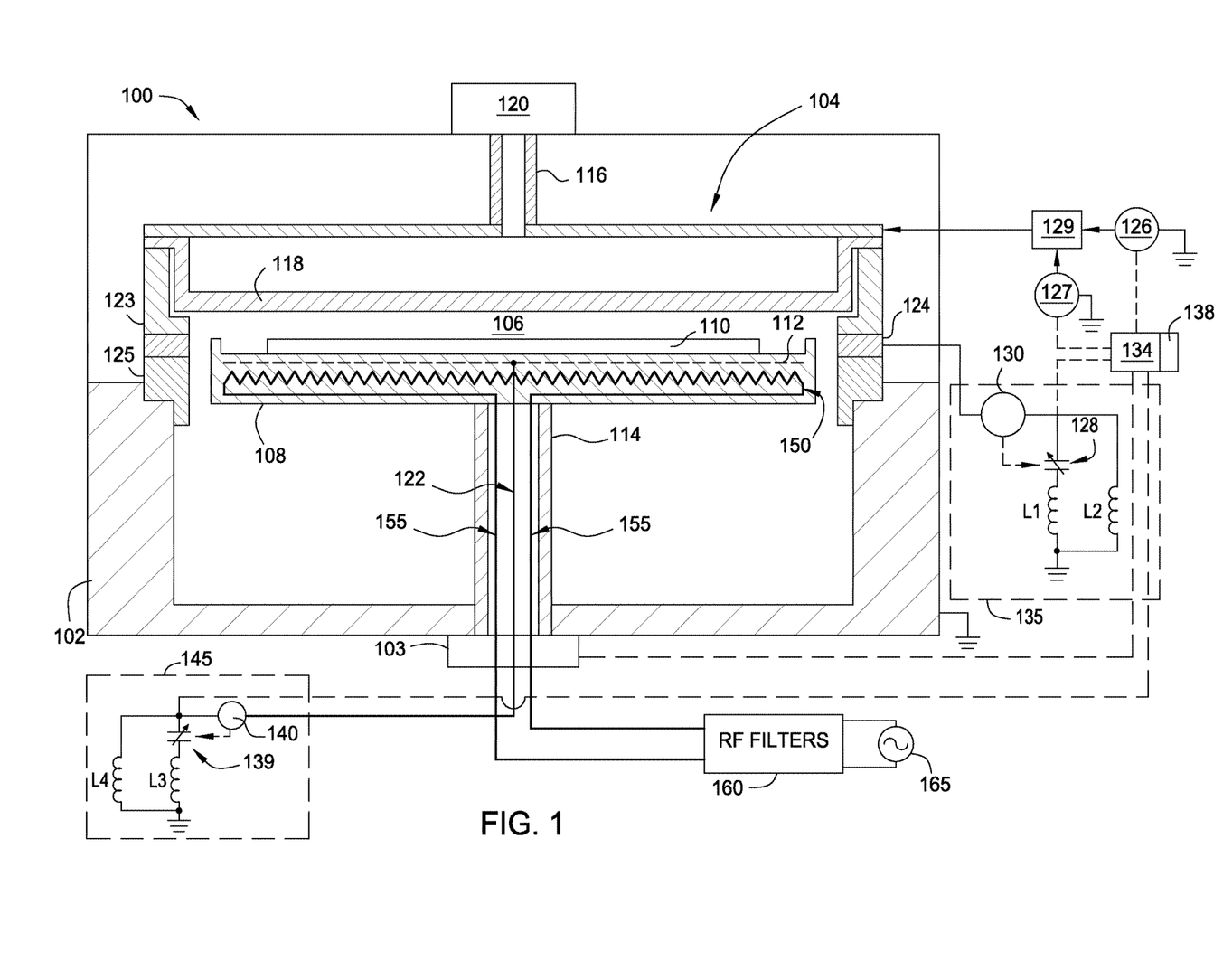
FIG. 1 is a schematic depiction of a plasma processing apparatus, according to one embodiment described herein.

FIG. 1 is a schematic side cross-sectional depiction of a plasma processing apparatus, according to one embodiment described herein. The apparatus includes a chamber 100 in which one or more films may be deposited on or etched from a substrate 110 disposed on a substrate pedestal 108. The chamber includes a chamber body 102 and a gas distribution assembly 104, which distributes gases uniformly into a process volume 106. The substrate pedestal 108, hereafter pedestal 108, is disposed within the process volume 106 and supports the substrate 110. The pedestal 108 includes a heating element 150. The pedestal 108 is movably disposed in the process volume 106 by a stem 114 that extends through the chamber body 102, where it is connected to a drive system 103 and bellows to allow the pedestal 108 to be raised, lowered, and/or rotated.

The gas distribution assembly 104 includes a gas inlet passage 116, which delivers gas from a gas flow controller 120 into a gas distribution manifold 118. The gas distribution manifold 118 includes a plurality of holes or nozzles (not shown) through which gaseous mixtures are injected into the process volume 106 during processing.

A high frequency RF power source 126 and a low frequency RF power source 127 provide electromagnetic energy through a match circuit 129 to power the gas distribution manifold 118, which acts as an RF powered electrode, to facilitate generation of a plasma within the process volume 106 between the gas distribution manifold 118 and the pedestal 108. The pedestal 108 includes a tuning electrode 112, which is electrically grounded through an RF rod 122, such that an electric field is generated in the chamber 100 between the powered gas distribution manifold 118 and the tuning electrode 112. In one embodiment, the tuning electrode 112 comprises a conductive mesh, such as a tungsten or molybdenum containing mesh that is disposed within the dielectric material that is used to form the pedestal 108. In one configuration, the pedestal 108 includes a ceramic material, such as aluminum nitride (AlN), silicon nitride (SiN), silicon carbide (SiC) or the like.

A ceramic ring 123 is positioned below the gas distribution manifold 118. Optionally, a tuning ring 124 is disposed between the ceramic ring 123 and an isolator 125, which electrically isolates the tuning ring 124 from the chamber body 102. The tuning ring 124 is typically made from a conductive material, such as aluminum, titanium, or copper. As depicted in FIG. 1, the optional tuning ring 124 is positioned concentrically about the pedestal 108 and substrate 110 during processing of the substrate 110. The tuning ring 124 is electrically coupled to an RF tuner 135, which includes a variable capacitor 128, such as a variable vacuum capacitor, that is terminated to ground through an inductor L1. RF tuner 135 also includes a second inductor L2 that is electrically coupled in parallel to the variable capacitor 128 to provide a path for low frequency RF to ground. RF tuner 135 also includes a sensor 130, such as a voltage/current (V/I) sensor, that is positioned between the tuning ring 124 and the variable capacitor 128 for use in controlling the current flow through the tuning ring 124 and the variable capacitor 128.

The tuning electrode 112 formed in the pedestal 108 is electrically coupled through RF rod 122 to an RF tuner 145, which includes a variable capacitor 139, such as a variable vacuum capacitor, that is terminated to ground through an inductor L3. RF tuner 145 also includes a second inductor L4 that is electrically coupled in parallel to the variable capacitor 139 to provide a path for low frequency RF to ground. RF tuner 145 also includes a sensor 140, such as a V/I sensor, that is positioned between the tuning electrode 112 and the variable capacitor 139 for use in controlling the current flow through the tuning electrode 112 and the variable capacitor 139.

One or more heating elements 150 are disposed within the pedestal 108 and are used to control a temperature profile across the substrate 110. As depicted, the heating elements 150 may be disposed beneath the tuning electrode 112; in other words, the tuning electrode 112 is disposed closer to the substrate than the heating elements 150. The heating elements 150 generally provide resistive heating to the substrate 110, and may be comprised of any feasible material, such as a conductive metal wire (e.g., refractory metal wire), patterned metal layer (e.g., molybdenum, tungsten or other refractory metal layer) or other similar conductive structure. The heating elements 150 are connected to one or more conductive rods 155, which may extend along the length of the stem 114 of the pedestal 108. In one embodiment, the rods 155 are positioned substantially parallel to the RF rod 122. The rods 155 couple the heating elements 150 to a heating power source 165, through one or more RF filters 160. The rods 122 and 155 are generally solid conductive elements (e.g., moderate diameter solid wire, non-stranded wire) that are formed from a conductive material, such as copper, nickel, gold, coated aluminum, a refractory metal or other useful material. The RF filters 160 are generally either low-pass filters or band-stop filters that are configured to block RF energy from reaching the heating power source 165. The configuration of the RF filters 160 will be discussed in further detail below. In one embodiment, the heating power source 165 provides a non-RF, alternating current (AC) power to the heating elements 150. For example, the heating power source 165 may provide three-phase AC power at a frequency of approximately 60 Hertz.

A system controller 134 controls the functions of the various components, such as the RF power sources 126 and 127, the drive system 103, the variable capacitors 128 and 139, and heating power source 165. The system controller 134 executes system control software stored in a memory 138. The system controller 134 comprises parts of or all of one or more integrated circuits (ICs) and/or other circuitry components. The system controller 134 may in some cases include a central processing unit (CPU) (not shown), memory (not shown), and support circuits (or I/O) (not shown). The CPU may be one of any form of computer processor that is used for controlling various system functions and support hardware and monitoring the processes being controlled by and within the chamber 100. The memory is coupled to the CPU, and may be one or more of a readily available memory, such as random access memory (RAM), read only memory (ROM), floppy disk, hard disk, or any other form of digital storage, local or remote. Software instructions (or computer instructions) and data may be coded and stored within the memory for instructing the CPU. The software instructions may include a program that determines which tasks are to be performed at any instant in time. The support circuits are also connected to the CPU for supporting the processor in a conventional manner. The support circuits may include cache, power supplies, clock circuits, timing circuits, input/output circuitry, subsystems, and the like.

In the plasma processing apparatus, chamber 100, an RF path is established between the powered gas distribution manifold 118 and the tuning electrode 112 via plasma. Further, by changing the capacitance of the variable capacitor 139, the impedance for the RF path through the tuning electrode 112 changes, in turn, causing a change in the RF field coupled to the tuning electrode 112 and a change in the RF return current through the tuning electrode 112 and the rod 122. Therefore, the plasma in the process volume 106 may be modulated across the surface of the substrate 110 during plasma processing. Controlling the RF field and modulating the RF return current may thus result in higher processing rate in depositing films onto or etching material from the substrate 110 with improved center-to-edge deposition thickness uniformity or etch removal uniformity.

Further, an additional RF path is established between the powered gas distribution manifold 118 and the tuning ring 124. Additionally, by changing the capacitance of the variable capacitor 128, the impedance for the RF path through the tuning ring 124 changes, in turn, causing a change in the RF field coupled to the tuning ring 124. For example, a maximum current and corresponding minimum impedance of the tuning ring 124 can be achieved by varying the total capacitance of the variable capacitor 128. Therefore, the plasma in the process volume 106 may also be modulated across the surface of the substrate 110 using this additional RF path.

During operation of the plasma processing apparatus, RF energy is normally delivered to a top, powered electrode (i.e., the powered gas distribution manifold 118), coupled through the plasma formed in the process volume 106 and the wafer and mainly returned through the wall of the chamber body 102 and/or tuning electrode 112 to ground. Since heating elements 150 may be embedded beneath the tuning electrode 112, RF energy can capacitively couple through the ceramic materials to the heating elements (i.e., RF leakage). The RF leakage to these undesired paths, such as heating elements and AC lines, not only affects the substrate processing results (i.e., deposition rate and uniformity on the substrate) but also cause electromagnetic interference (EMI) on or damage to the heating element AC power sources.

By adjusting the RF tuner 145 (and especially variable capacitor 139) to compensate for the net reactance caused by other tuning assembly components (e.g., tuning electrode 112, rod 122) at an operating frequency of the powered gas distribution manifold, a minimum impedance path through the tuning assembly may be provided to ground. Thus, a greater proportion of RF energy will be coupled through this path, which includes the tuning electrode, rod 122 and RF tuner 145, with less RF leakage into other components of the plasma processing apparatus. The minimum impedance path provides greater efficiency as well as greater control of the application of RF energy for depositing films onto or etching material from the substrate. However, typically due to the need to use a mesh type of tuning electrode 112 within the pedestal 108 for manufacturing reasons, and the need to position the heating elements 150 near the substrate supporting surface of the pedestal 108, unavoidably an amount of the RF energy provided to the process volume 106 leaks to the heating elements 150.

Conversely, the RF filters 160 may be included in the heating assembly to provide a relatively greater impedance path to ground to minimize the amount of RF leakage to the heating elements 150. The RF filters 160 may be inserted in between heating elements 150 and the corresponding AC source(s) to attenuate RF energy and to suppress RF leakage current. In some configurations, the impedance of the tuning electrode 112 to ground is substantially less than the impedance of the heating elements 150 to ground.

Figure 2:
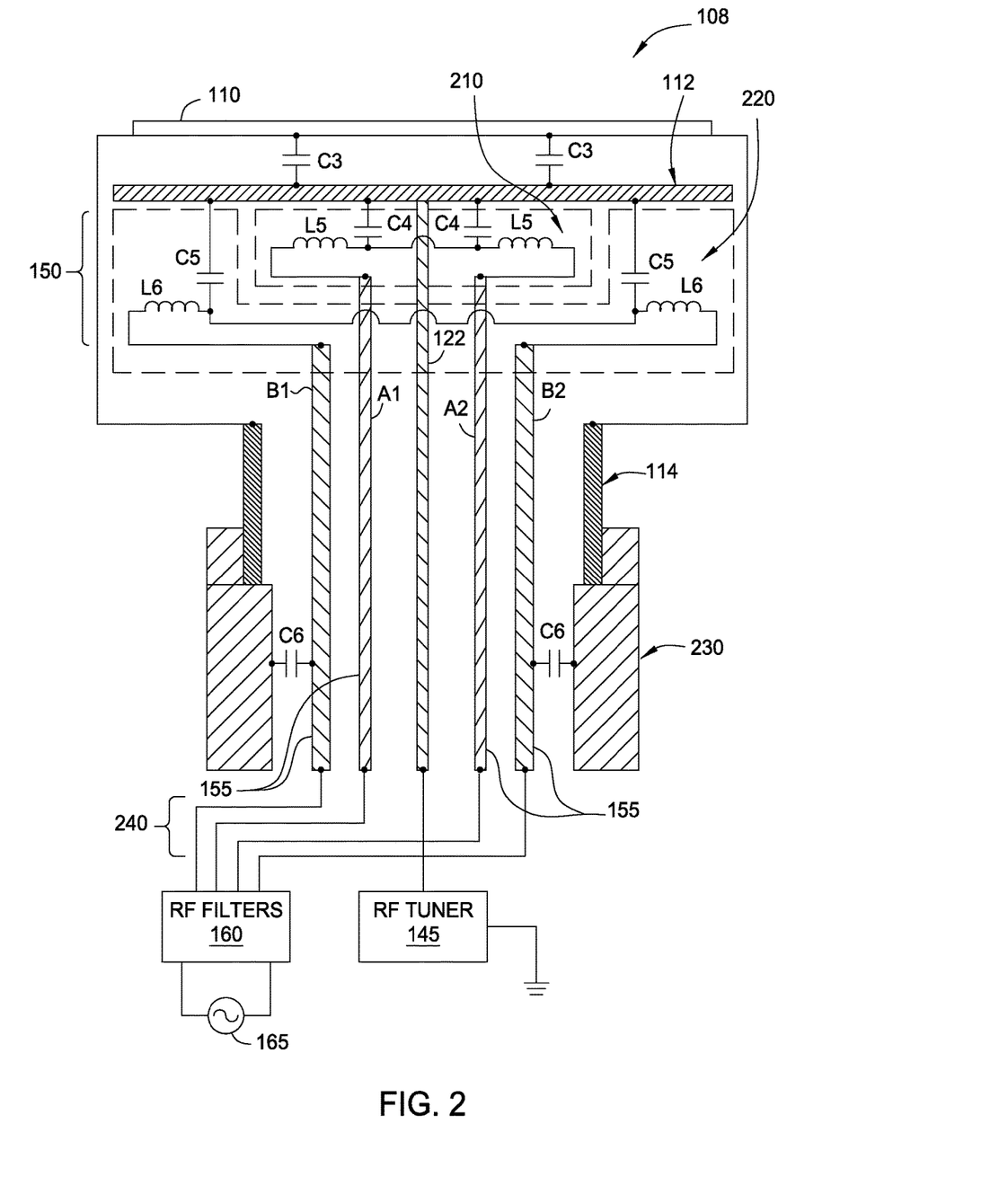
FIG. 2 is a schematic depiction of a substrate support pedestal, according to one embodiment described herein.

FIG. 2 is a schematic depiction of a substrate support pedestal 108, according to one embodiment described herein. The substrate support pedestal 108 may generally be used in a plasma processing apparatus, such as the apparatus described above with respect to FIG. 1.

Pedestal 108 is connected to stem 114, which may be constructed of an insulative material, such as a ceramic (e.g., AlN, SiC, quartz). The stem 114 in turn is connected to a pedestal base 230, which may be constructed of a material, such as aluminum, stainless steel, or other desirable material.

Pedestal 108 includes a tuning assembly comprising tuning element 112, RF rod 122, and RF tuner 145. Pedestal 108 also includes a heating assembly comprising a plurality of heating elements 150. The heating elements may be distributed among a plurality of heating zones that are used to adjust the temperature profile across the substrate during processing. The plurality of heating zones may include an inner zone 210 and outer zone 220. The heating elements 150 are coupled through rods 155 to one or more RF filters 160; the four rods 155 shown in FIG. 2 are referred to in subsequent figures as A1, A2, B1, and B2 . In one embodiment, each of the rods 155 is coupled to a respective RF filter 160, which may have the same or different properties. Groups of rods may correspond to different heating zones; for example, rods A1 and A2 correspond to the heating elements of inner zone 210, while rods B1 and B2 correspond to heating elements of outer zone 220. In one embodiment, two rods 155 correspond to a particular zone. For example, the heating power source 165 delivers AC power through RF filters 160 into a first rod of the two rods; the AC power travels through the first rod and heating elements 150 before returning through the second rod and RF filters 160 to ground.

Components of the heating assembly will generally have a non-zero impedance that reflects both the intrinsic electrical properties of the components and the proximity to other components in the pedestal or plasma processing apparatus. For example, heating elements 150 and rods 155 may couple RF energy from tuning assembly components during operation. The resistive portion of components' impedance is typically a non-zero value that is not affected by changes in operating frequency and is not able to be compensated for during processing. Therefore, for ease of description, resistive components are not depicted in this figure.

The impedance of the heating elements 150 and rods 155 may thus be modeled as including an inductive element and a capacitive element that reflect the RF coupling to one or more components. For example, the impedance of rod A1 includes a capacitance C4 reflecting a coupling of rod A1 with components of the tuning assembly (i.e., with tuning electrode 112 and RF rod 122), and includes an inductance L5 reflecting inductive properties of the inner zone 210 heating elements and the rod A1, as well as the inductive coupling caused by relatively large current flow through the primary RF return path (i.e., RF rod 122). Rod A2 may generally have the same electrical properties as rod A1 and may be disposed similarly, so that rod A2 is also modeled with capacitance C4 and inductance L5 . Of course, rods B1 and B2 may share electrical properties, which may differ from rods A1 and A2 , and thus rods B1 and B2 and outer zone 220 heating elements may each be modeled using a capacitance C5 and an inductance L6.

As shown, each of rods B1 and B2 also include a capacitance C6 that represents a coupling between the rod and the typically grounded pedestal base 230. As rods A1 and A2 may have electrical properties and dispositions differing from rods B1 and B2, rods A1 and A2 may also have a coupling (not shown) with the pedestal base 230 that may differ from capacitance C6, or may be negligibly small.

To provide greater efficiency and greater control of the application of RF energy for depositing films onto or removing material from a substrate, ideally a maximum amount of the RF energy delivered by the powered gas distribution manifold will be coupled through the wall of the chamber body 102 and tuning assembly to ground, with no charge coupled into the heating assembly or into other components (i.e., RF leakage). Therefore, it is advantageous to reduce the impedance of the tuning assembly to a minimum value, and to increase the impedance of the heating assembly (e.g., heating elements 150 and one or more conductive rods). As discussed above, the components may all include some real, non-zero impedance (i.e., resistance) that cannot be compensated for during processing. However, the reactance of different components may be controlled by adjusting capacitive or inductive elements within the tuning assembly and the heating assembly.

To reduce the impedance of the tuning assembly to a minimum value and thereby couple more of the delivered RF energy into the tuning assembly, components of RF tuner 145 may be adjusted to compensate for the reactance of the tuning assembly components at the operating frequency. For example, the capacitance of variable capacitor 139 may be tuned when the tuning assembly has a positive reactance value for a particular frequency. The negative reactance provided by the variable capacitor 139 may thus compensate for the positive reactance.

To increase the impedance of the heating assembly, one or more RF filters 160 are coupled to the rods 155 (as shown, rods A1, A2, B1, B2). The RF filters are either low-pass filters or band-stop filters that are configured to block RF energy from reaching the heating power source 165.

The RF filters 160 may be coupled to rods 155 though conductive connections 240 near the pedestal base 230. In one embodiment, the connections 240 may include a short rigid lead for each rod, so that each RF filter 160 is directly coupled to each respective rod or disposed proximate to the pedestal base 230 and to the respective rods. Further, each connection 240 may be maximally spaced apart to minimize capacitive coupling between connections. It is believed that connections that include a flexible and/or shielded multi-conductor cable disposed between the rods and the filter may introduce additional impedance and may provide a shunt path for RF or other signals, as each conductor will have resistive properties and may have coupling with the other conductors and with the grounded shield. Therefore, in some embodiments, it is desirable to position the RF filter as close to the rods as mechanically feasible, and in some cases directly coupling the RF filter to each of the rods.

Figure 3:
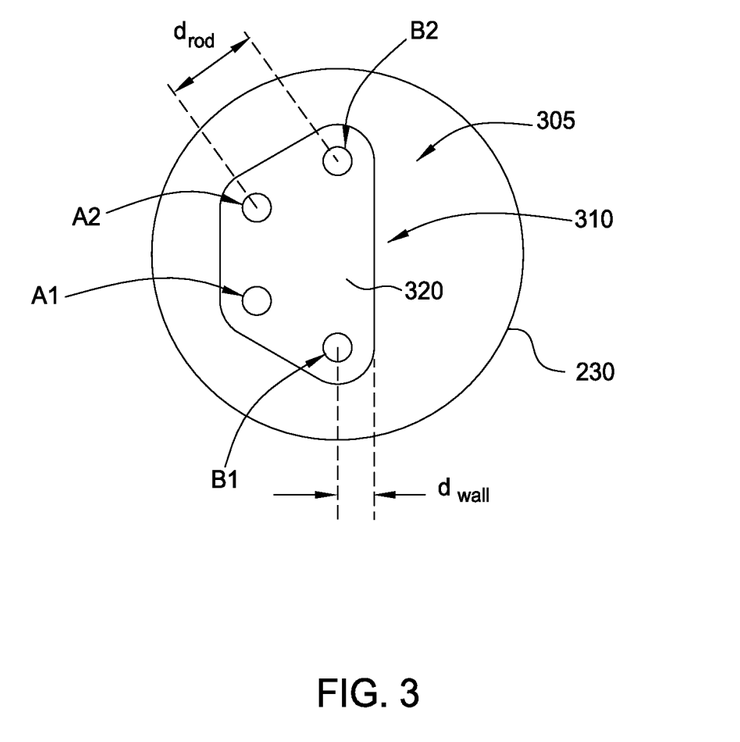
FIG. 3 illustrates a bottom view of a substrate support pedestal base, according to one embodiment described herein.

FIG. 3 illustrates a bottom view of a substrate support pedestal base 230, according to one embodiment described herein. The pedestal base 230 includes a bottom surface 305 and a cutout portion 310 that extends partially into the pedestal base (as viewed, extending into the page) within which end portions of rods A1, A2, B1, and B2 are disposed. Of course, bottom surface 305 may include other cutouts or mechanical connections for the pedestal base 230.

The rods A1, A2, B1, and B2 generally extend along the length of the pedestal stem 114 to the heating elements 150. To pass from the cutout portion 310 through the pedestal base 108, each rod may extend through a respective opening (not shown) in the pedestal base in the area of cutout portion 310. In order to prevent the rods from electrically shorting to the pedestal base 230 (which may be grounded), an insulating device (such as a ceramic tube; not shown) may be disposed in each opening between the rods A1-B2 and the pedestal base 230. To provide additional lateral support, a ceramic disk 320 may be disposed in the cutout portion 310 for supporting and electrically isolating the rods.

Within the cutout portion 310, each rod may be disposed to maintain at least a minimum distance $d_{rod}$ from the other rods. The distance $d_{rod}$ may be selected to provide a desired capacitive coupling between two rods (or between a rod and RF rod 122 (not shown in FIG. 3)), or to minimize the capacitive coupling. The rods may also be disposed at least a minimum distance $d_{wall}$ from a wall of the cutout portion 310, in order to prevent a shunt path (i.e., to reduce capacitive coupling) between rods and the pedestal base 230.

Figure 4:
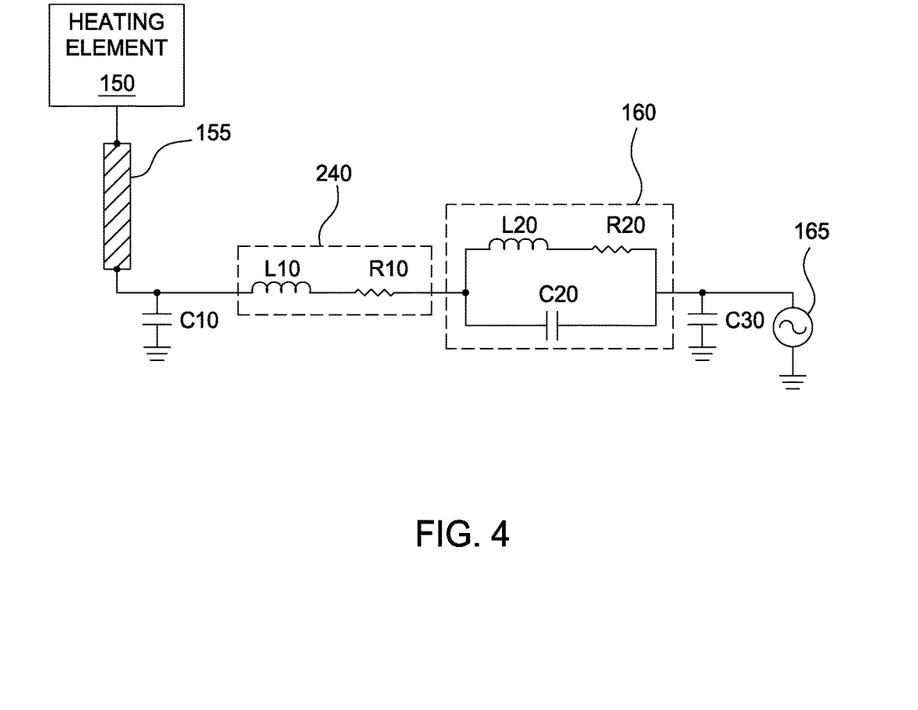
FIG. 4 is an electrical circuit diagram for an RF filter, according to one embodiment described herein.

FIG. 4 is an electrical circuit diagram for an RF filter, according to one embodiment described herein. The RF filter 160 may be used in various embodiments of the substrate support pedestal, pedestal base, and the plasma processing apparatus described above.

As shown, a heating element 150 is coupled to a conductive rod 155 that extends along the length of the pedestal. In one embodiment, each conductive rod 155 may be coupled to a respective RF filter 160. The rod is connected to RF filter 160 via connection 240, whose electrical characteristics are represented by resistance R10 and inductance L10. As described above, the connection 240 may be a short rigid lead, or solid wire lead, that is disposed near the pedestal base 230. Capacitance C10 represents a feed-through capacitance that occurs where connection 240 passes through an opening in a grounded metal enclosure surrounding the RF filter 160. Capacitance C10 may also reflect part of the capacitive coupling between RF filter components and the grounded metal enclosure. The length of connection 240 may be selected to present a minimal impedance (i.e., to minimize values of R10 and L10).

The RF filter 160 includes two branches connected in parallel. A first branch includes an inductance L20 in series with resistance R20, and a second branch includes a capacitance C20. Connection 240 is connected in series at one end of the RF filter 160, and the heating power supply 165 is connected at the other end of the RF filter 160. In some configurations, a capacitance C30 and the heating power supply 165 are connected in parallel at one end of the RF filter 160. The capacitance C30 may represent a second feed-through capacitance occurring when a connection from the RF filter 160 to the AC power supply passes through a second opening in the grounded metal enclosure, as well as the value of any discrete capacitors physically connected between the AC power supply and ground.

The RF filter 160 may have its electrical components selected to provide a desired resonance frequency for the RF filter. In one embodiment, the RF filter 160 includes a discrete inductor disposed within a grounded metal enclosure, which, in some cases, surrounds the various RF filter 160 circuit elements. In another embodiment, more than one RF filter 160 is included in a shared enclosure. Resistance R20 may represent resistive properties of the multi-turn inductor, and capacitance C20 may represent a self-capacitance of the multi-turn inductor (i.e., capacitance occurring between turns of the inductor), as well as coupling occurring between the inductor and the conductive enclosure, and between the inductor and other inductors in a shared enclosure. The number of turns of the inductor may be selected to achieve a combination of desired values for inductance L20 and capacitance C20, so that the RF filter 160 may exhibit the desired filter response within the heating assembly. Therefore, in some embodiments, by use of the physical placement of the multi-turn inductor L20 relative to a grounded surface of the enclosure of the RF filter 160, a relatively fixed and stable capacitance C20 can be created and used to form part of the RF filter circuit. In this case, there is no need for the complex and expensive variable capacitance circuits and/or the need for the unreliable manually adjusted variable capacitance circuits. However, in some configurations, variable capacitance circuits and/or manually adjusted variable capacitance circuits may be used to form the capacitance C20.

Further, the value of inductance L20 may be selected using the equation:

$$\omega = \frac{1}{\sqrt{LC}}$$

where $\omega=2\pi \times$(the desired resonance frequency of RF filter 160), L=the equivalent inductance of L10 and L20, and C=the equivalent capacitance of C10, C20, and C30. In one embodiment, capacitance C30 includes a discrete capacitor having a value that is relatively large compared to the other capacitances C10 and C20 (or their component capacitances). For example, C30 may include a 47 nano-Farad (nF) capacitor. At typical operating frequencies (say, greater than 1 MHz), the reactance contributed by the 47 nF capacitor will be negligibly small, so that it appears as a short to ground at these frequencies. By eliminating the contribution of C30, the equation used to determine L20 may thus be simplified to:

$$\omega = \frac{1}{\sqrt{L20 \times (C10 + C20)}}$$

As will be discussed further below, the resonance frequency of RF filter 160 may be selected to provide a desired impedance of the RF filter at a particular operating frequency of the powered gas distribution manifold. By selecting the resonance frequency in this way, the RF filter 160 may present a sufficiently large impedance to prevent RF leakage into the heating assembly and to prevent EMI from being delivered to the heating power supply 165 and/or damaging the heating power supply 165.

Figure 5:
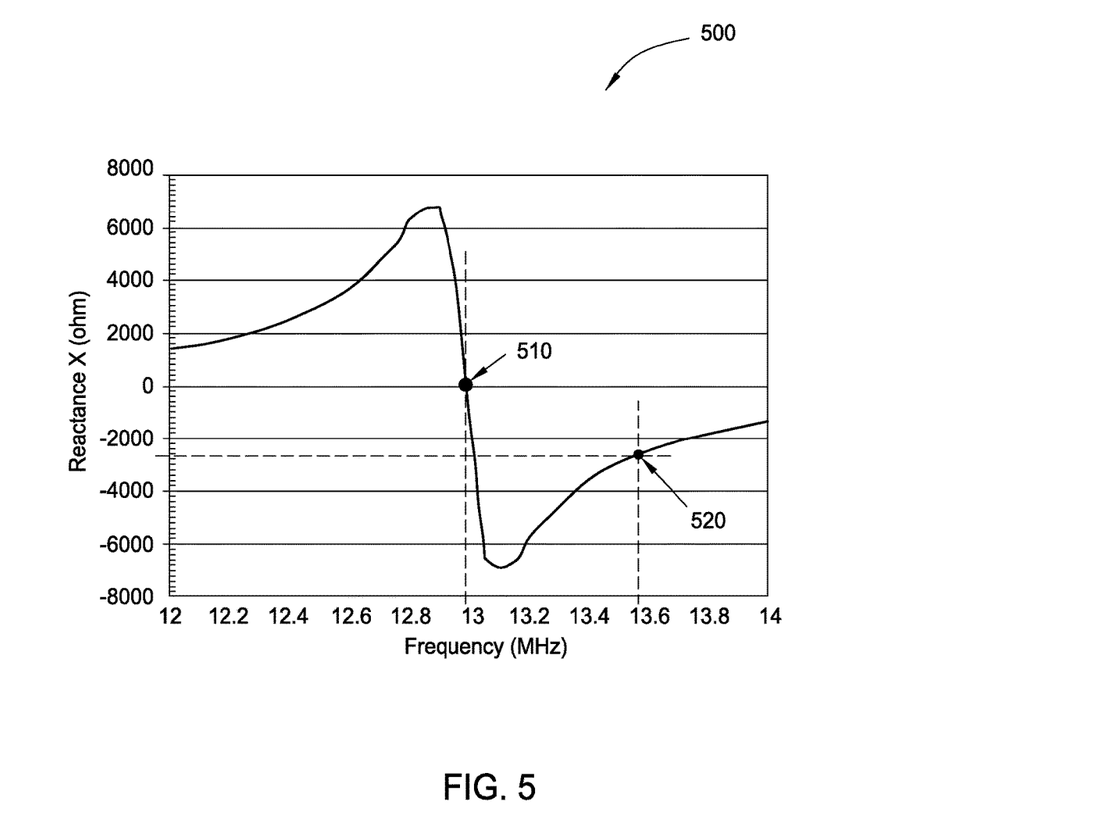
FIG. 5 illustrates a filter response of an RF filter, according to one embodiment described herein.

FIG. 5 illustrates a filter response of an RF filter, according to one embodiment described herein. Graph 500 depicts the reactance at rod B1 of the RF filter 160 (as measured looking into the RF filter) and is plotted as a function of frequency. In this embodiment, the resonance frequency of RF filter 160 is 12.98 megahertz (MHz), and the operating frequency of the powered gas distribution manifold is approximately 13.56 MHz. Point 510 shows an approximately zero reactance value at 12.98 MHz (where the negative reactance caused by the capacitive elements of RF filter 160 equals the positive reactance caused by the inductive elements). As the operating frequency shifts away (in either direction) from the RF filter resonance frequency, the magnitude of the reactance value sharply increases to peaks of about 7000 ohms (7 k$\Omega$) at approximately 12.9 MHz and 13.1 MHz, then gradually decreases. Of course, the sharpness of the slope will depend on the Q factor associated with the RF filter circuit. For the example operating frequency of 13.56 MHz, the reactance value is approximately −2.6 k$\Omega$, indicating a predominantly capacitive reactance for the RF filter at this frequency.

Based on a given (i.e., known) operating frequency, the resonance frequency for the RF filter 160 may be selected in order to provide a desired impedance value of the RF filter 160 at the operating frequency. For this example, refer to graph 500 and assume that the filter response maintains its basic shape even when shifted left and right to reflect different resonance frequency values. If the resonance frequency is selected to be closer to the operating frequency of 13.56 MHz, for example 13.45 MHz, the filter response would shift right, and the reactance at 13.56 MHz would be very close one of the peak reactance values described above (about −7 k$\Omega$, which is a predominantly capacitive reactance). Of course, the resonance frequency could also be selected to be greater than the operating frequency, so that the operating frequency falls on the predominantly inductive portion of the filter response. For example, selecting a resonance frequency of 13.65 MHz would very nearly correspond to the other peak reactance value of FIG. 5 (about 7 k$\Omega$ predominantly inductive).

Based on the selected resonance frequency, one or more components of the RF filter 160 may be selected. For example, and as described above, RF filter 160 may include a discrete inductor. To create an RF filter having the selected resonance frequency, parameters of the inductor may then be selected (such as a number of turns, a radius, a length, and so forth). Selecting an electrical component for use in the RF filter 160 may also include considering other electrical properties of the component at RF frequencies. For example, an inductor may also exhibit resistive and/or capacitive properties at RF frequencies. The components of the RF filter may thus be selected to account for these other properties in order to achieve a desired reactance value at the operating frequency. Of course, selecting RF filter components may include other types of components (resistors, capacitors, etc.) or different combinations or configurations of these components.

As the selected components of the RF filter 160 are installed, for example installed into a heating assembly prior to operation of the plasma processing apparatus, the components of the RF filter may be positioned relative to each other, and/or relative to other components of the heating assembly, to achieve a desired reactance value for the RF filter circuit. Based on their positions and orientations, the RF filter components may have capacitive and/or inductive couplings with each other that may impact the frequency response of the RF filter. Additionally, the RF filter components may be installed into a protective enclosure, or into an assembly, that may have electrical characteristics that cause further couplings impacting the RF filter's frequency response. Therefore, the individual components of the RF filter 160 may each be positioned so that the various couplings can be accounted for in the resonance frequency. Of course, this may be an iterative process, as moving one component may require adjustment to the properties of the same component (e.g., selecting a different number of turns or length) or to other components.

As described above, to achieve a desired impedance of the RF filter 160 for a particular operating frequency of the powered gas distribution manifold, components of the RF filter may be selected (and appropriately positioned) that result in the selected filter resonance frequency. In most cases, the resonance frequency will differ from the operating frequency. However, to ensure that the impedance value is sufficiently large to prevent RF energy from coupling into the heating assembly, the filter resonance frequency should be selected relatively close to the operating frequency. In one embodiment, the filter resonance frequency may be selected so that the operating frequency falls within a desired range of the resonance frequency. For example, the resonance frequency may be selected so that the operating frequency falls within ±5% (or ±10%) of the resonance frequency. Of course, the ranges could be specified as frequency differences (e.g., within 1 MHz) instead of percentages. In some cases, the resonance frequency may be selected so that the impedance of the RF filter 160 circuit at the operating frequency is a certain desired percentage of the peak impedance (e.g., 7000 Ohms in FIG. 5). In one example, the resonance frequency may be selected so that the impedance of the RF filter 160 circuit at the operating frequency is between about 10% and 100% of the peak impedance, such as an impedance of between about 15% and 60% of the peak impedance. In one configuration, the operating frequency is within a predetermined range that is positioned about the resonant frequency of the RF filter 160 circuit. In one example, the operating frequency is within a predetermined range that is defined as being twice the difference of the resonant frequency and a first frequency at which the measured reactance is within 10% of the peak reactance.

Beyond keeping the operating frequency within a predetermined range of the resonance frequency, the resonance frequency may also be advantageously selected so that the operating frequency is at least a minimum range from the resonance frequency. While the reactance peaks shown in FIG. 5 (corresponding to about 12.9 MHz and 13.1 MHz) each provide an attractively large reactance magnitude, selecting the resonance frequency so that the operating frequency falls at or very near to a reactance peak may not be so beneficial. For example, if the operating frequency were located on the sharp slope of graph 500 (crossing zero reactance at the resonance frequency), any change to the operating frequency or resonance frequency (which could result from small physical changes during operation, such as deterioration or movement of components or connections) would result in a large change to the RF filter impedance. Such large changes of impedance would be undesirable as disturbing the stability of the plasma process, as different and unpredictable amounts and distributions of RF energy would be coupled into the tuning electrode. In some cases, if changes caused the operating frequency to equal the resonance frequency, the reactance of the RF filter would equal zero, and a large portion of the RF energy could be coupled into the heater assembly instead of the tuning assembly. Large changes in impedance may also occur near the reactance peaks on the opposite sides (i.e., less than about 12.9 MHz and greater than about 13.1 MHz). Therefore, it may be advantageous to select a RF filter resonance frequency so that the operating frequency would fall outside some minimum range of the resonance frequency. For example, the resonance frequency may be selected so that the operating frequency is at least ±2.5% (or ±3.5%) of the resonance frequency. In another example, the resonance frequency may be selected so that the operating frequency is at least ±2.5% (or ±3.5%) of the resonance frequency, but less than a frequency at which the impedance of the RF filter 160 circuit drops to a level of about 10% of the peak impedance.

While the foregoing is directed to embodiments of the present invention, other and further embodiments of the invention may be devised without departing from the basic scope thereof, and the scope thereof is determined by the claims that follow.

The invention claimed is:

1. A plasma processing apparatus, comprising:
a chamber body and a powered gas distribution manifold enclosing a process volume;
a pedestal disposed in the process volume, the pedestal having a substrate supporting surface and a base comprising a stem extending below the substrate supporting surface with a cutout portion extending into the base;
a heating assembly comprising a first heating element and a second heating element disposed within the pedestal, the second heating element disposed outwardly of the first heating element, and a plurality of conductive rods disposed along a length of the stem, wherein the first heating element is positioned for controlling a temperature profile of an inner zone of the substrate supporting surface and the second heating element is positioned for controlling a temperature profile of an outer zone of the substrate supporting surface, wherein each of the first and second heating elements are electrically coupled to at least one of the plurality of conductive rods, and wherein each of the plurality of conductive rods are electrically coupled to a radio frequency (RF) filter circuit comprising a first inductor configured in parallel with a first capacitance;
a ceramic disk disposed in the cutout portion, the ceramic disk supporting each of the plurality of conductive rods, and the ceramic disk electrically isolating the conductive rods from one another;
a tuning assembly comprising a tuning electrode that is disposed within the pedestal between the first and second heating elements and the substrate supporting surface, wherein the first heating element is capacitively coupled to an inner zone of the tuning electrode and the second heating element is capacitively coupled to an outer zone of the tuning electrode, wherein at least one of the conductive rods that is coupled to the second heating element is capacitively coupled to the base of the pedestal; and
an RF tuner comprising:
a sensor having a first terminal electrically coupled directly to the tuning electrode;
a variable capacitor having a first terminal electrically coupled directly to a second terminal of the sensor;
a first inductor having a first terminal electrically coupled directly to a second terminal of the variable capacitor and a second terminal electrically coupled to ground; and
a second inductor having a first terminal electrically coupled directly to the second terminal of the sensor and a second terminal electrically coupled to ground, the second inductor directly connected in parallel to the variable capacitor and the first inductor;
wherein the RF filter circuit has a higher impedance than the RF tuner.

2. The apparatus of claim 1, wherein the RF filter circuit has a resonance frequency within a non-zero, predetermined range of an operating frequency of the powered gas distribution manifold.

3. The apparatus of claim 2, wherein the predetermined range is defined as being a difference of the resonant frequency and a first frequency at which a measured reactance is within 20% of a peak reactance.

4. The apparatus of claim 1, wherein each conductive rod of the plurality of conductive rods comprises a solid conductor and extends between the respective first and second heating elements and the RF filter circuit.

5. The apparatus of claim 1, wherein the tuning electrode comprises a conductive mesh that is coupled through at least one of the plurality of conductive rods to the RF tuner.

6. The apparatus of claim 1, wherein the first capacitance is formed by disposing the first inductor a distance from a grounded surface.

7. A substrate support assembly, comprising:
a substrate support pedestal having a substrate supporting surface and a base comprising a stem extending below the substrate supporting surface with a cutout portion extending into the base;
a heating assembly comprising a first heating element and a second heating element disposed within the pedestal, the second heating element disposed outwardly of the first heating element, and a plurality of conductive rods disposed along a length of the stem, wherein the first heating element is positioned for controlling a temperature profile of an inner zone of the substrate supporting surface and the second heating element is positioned for controlling a temperature profile of an outer zone of the substrate supporting surface, wherein each of the first and second heating elements are electrically coupled to at least one of the plurality of conductive rods, and wherein each of the plurality of conductive rods are electrically coupled to a radio frequency (RF) filter circuit comprising a first inductor configured in parallel with a first capacitance;
a ceramic disk disposed in the cutout portion, the ceramic disk supporting each of the plurality of conductive rods, and the ceramic disk electrically isolating the plurality of conductive rods from one another;
a tuning assembly comprising a tuning electrode that is disposed within the pedestal between the first and second heating elements and the substrate supporting surface, wherein the first heating element is capacitively coupled to an inner zone of the tuning electrode and the second heating element is capacitively coupled to an outer zone of the tuning electrode, wherein at least one of the conductive rods that is coupled to the second heating element is capacitively coupled to the base of the pedestal; and
an RF tuner comprising:
a sensor having a first terminal electrically coupled directly to the tuning electrode;
a variable capacitor having a first terminal electrically coupled directly to a second terminal of the sensor;
a first inductor having a first terminal electrically coupled directly to a second terminal of the variable capacitor and a second terminal electrically coupled to ground; and
a second inductor having a first terminal electrically coupled directly to the second terminal of the sensor and a second terminal electrically coupled to ground, the second inductor directly connected in parallel to the variable capacitor and the first inductor;

wherein the RF filter circuit has a higher impedance than the RF tuner.

8. The substrate support assembly of claim 7, wherein the RF filter circuit has a resonance frequency within a nonzero, predetermined range of an operating frequency of a powered gas distribution manifold.

9. The substrate support assembly of claim 7, wherein each conductive rod of the plurality of conductive rods comprises a solid conductor and extends between the heating elements and the RF filter circuit.

10. The substrate support assembly of claim 9, wherein each of the solid conductive rods are separated from the other rods by at least a first predetermined minimum distance, and each of the rods are separated from a wall of the cutout portion of the base by at least a second predetermined minimum distance.

11. The substrate support assembly of claim 7, wherein the tuning electrode comprises a conductive mesh that is coupled through at least one of the plurality of conductive rods to the RF tuner.

12. The apparatus of claim 1, wherein each of the conductive rods pass through a respective opening formed in the ceramic disk.

13. The apparatus of claim 12, wherein each of the conductive rods are separated from the other rods by at least a first minimum distance, and each of the conductive rods are separated from a wall of the cutout portion of the base by at least a second minimum distance.

14. The substrate support assembly of claim 7, wherein the first capacitance is formed by disposing the first inductor a distance from a grounded surface.

15. The substrate support assembly of claim 14, wherein each of the conductive rods pass through a respective opening in the ceramic disk.

* * * * *